US005452361A

United States Patent [19]

Jones

[11] Patent Number: 5,452,361

[45] Date of Patent: Sep. 19, 1995

[54] REDUCED VLF OVERLOAD SUSCEPTIBILITY ACTIVE NOISE CANCELLATION HEADSET

[75] Inventor: Owen Jones, Alreford Colchester, England

[73] Assignee: Noise Cancellation Technologies, Inc.

[21] Appl. No.: 81,420

[22] Filed: Jun. 22, 1993

[51] Int. Cl.[6] .......... H03B 29/00

[52] U.S. Cl. .......... 381/71; 381/94

[58] Field of Search .......... 381/71, 72, 74, 94, 381/96, 57, 95, 104, 105, 108; 415/119; 267/136

[56] References Cited

U.S. PATENT DOCUMENTS

| | | | |
|---|---|---|---|
| 4,527,282 | 7/1985 | Chaplin et al. | 381/94 |
| 4,837,834 | 6/1989 | Allie | 381/71 |
| 4,953,217 | 8/1990 | Twiney et al. | 381/71 |
| 5,381,473 | 1/1995 | Andrea et al. | 381/71 |

FOREIGN PATENT DOCUMENTS

| | | | |
|---|---|---|---|
| 0089798 | 4/1991 | Japan | 381/94 |
| 0274898 | 12/1991 | Japan | 381/94 |

*Primary Examiner*—Curtis Kuntz
*Assistant Examiner*—Huyen D. Le
*Attorney, Agent, or Firm*—James W. Hiney

[57] ABSTRACT

The susceptibility of an active noise cancellation system to overloading due to very low frequencies is reduced by subtracting the low frequency components of an applied noise field from the residual signal. Low frequency components of the applied noise field outside the normal range of human hearing are detected by an external sensor and isolated by a filter circuit. The isolated low frequency signal is subtracted from the residual signal, resulting in a modified residual signal with reduced low frequency components. The cancellation system thus eliminates very low frequency cancellation signals, without sacrificing bandwidth or system performance within the audible range.

10 Claims, 2 Drawing Sheets

FIG. 1
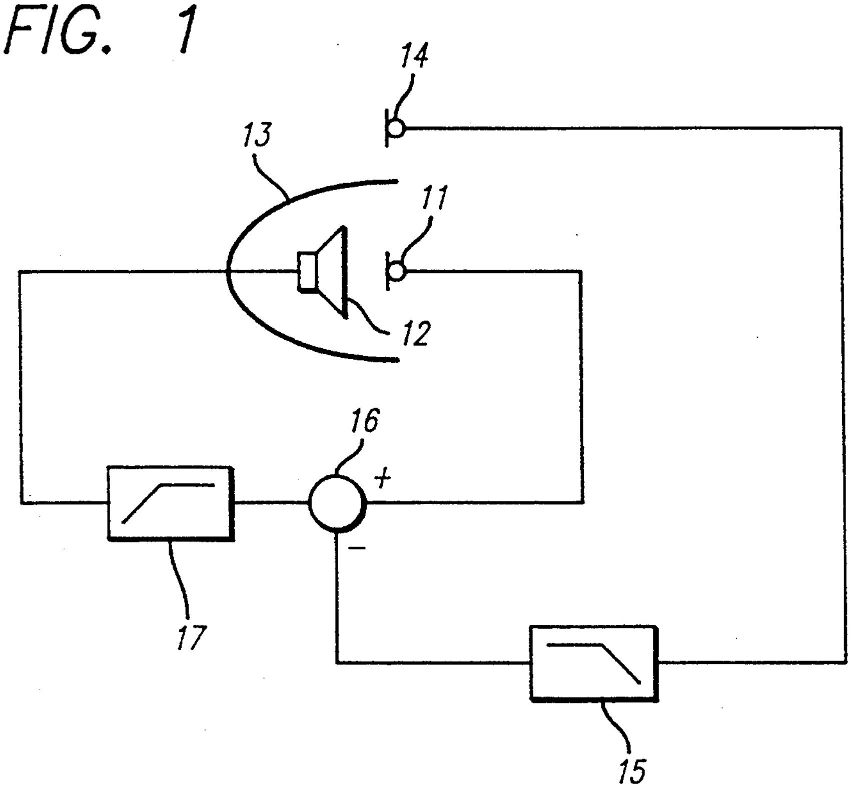
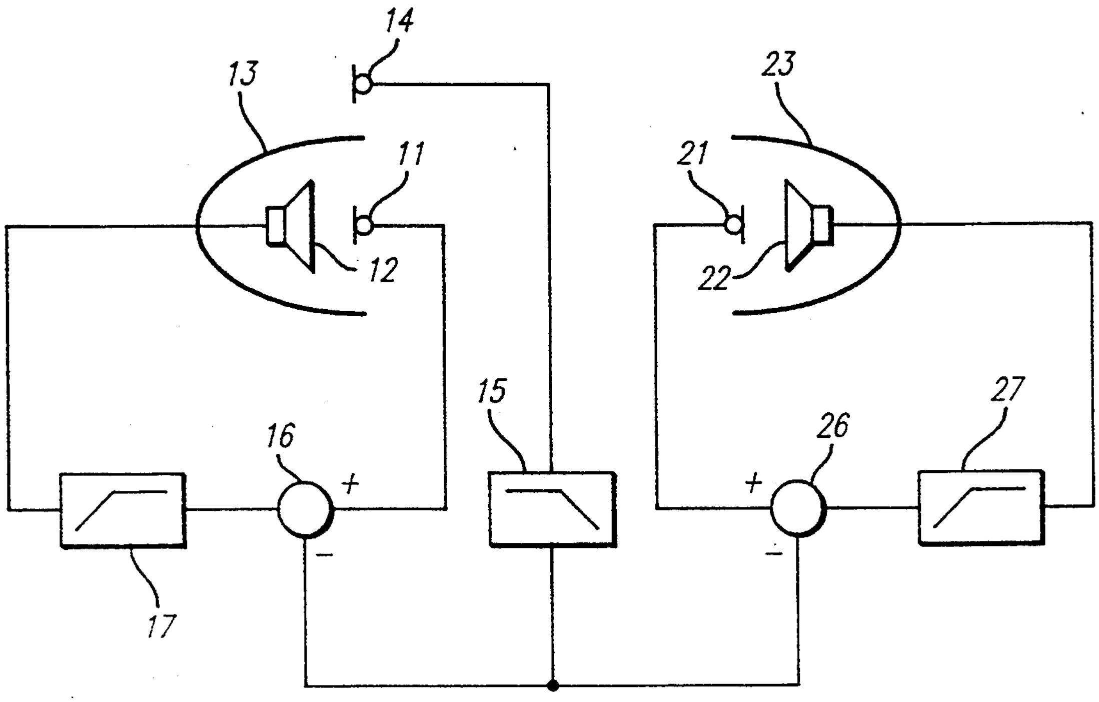
FIG. 2

REDUCED VLF OVERLOAD SUSCEPTIBILITY ACTIVE NOISE CANCELLATION HEADSET

BACKGROUND OF THE INVENTION

1. Field of the Invention

The present invention relates to active noise and vibration cancellation systems, and more particularly, to headsets utilizing active noise cancellation.

2. Description of the Related Art

In various circumstances ambient sound can be disconcerting to, or can create an environment that is uncomfortable or unsafe for, humans. Conventionally, passive headsets or earplugs have been employed in an attempt to reduce the perceived level of ambient noise. In conventional headsets or earplugs, the ambient sound perceived by the wearer is reduced by occlusion of sound from the earpieces and absorption of transmitted sound by materials within the earpieces. The effectiveness of the attenuation depends upon the nature of the ambient noise and the qualities and characteristics of the individual headset or earplugs.

In various applications, however, passive attenuation of sound may be unsatisfactory. Some environments, for example, are simply too noisy for comfort or even safety with only passive earplugs. In other environments, the elimination of extraneous noise is a paramount concern, and satisfactory results cannot be achieved using only passive means. Although the amplitude of the extraneous noise may be significantly diminished, it is almost impossible to completely isolate the wearer from extraneous noise using passive means at low frequencies.

To provide higher quality sound reduction, active noise cancellation headsets attenuate unwanted sound using destructive interference (superposition). Unwanted sound is canceled by propagating anti-noise, identical to the waveform of the unwanted noise but inverted, which interacts with and cancels the unwanted waveform. Anti-noise may be generated by a sound generating actuator driven by a controller. The controller drives the actuator according to signals representative of the noise field to be canceled. More specifically, the residual noise (i.e., the noise remaining after superposition) is sensed, typically by a microphone, and a signal indicative of the residual noise is provided to the controller. The controller drives the actuator accordingly.

Active noise cancellation systems are often susceptible to overload as a result of very low frequency (VLF) disturbances. To generate low frequency anti-noise signals, the actuator (e.g., sound generator) must commonly generate large amplitude signals requiring considerable displacement of the cone or diaphragm of the actuator. Use of sufficiently large actuators, however, is not practical in various small systems. For example, in headsets, mobility and comfort considerations do not permit large displacement actuators. This phenomena is particularly a problem with open-back on-the-ear headsets.. Due to the inherent bass roll-off of such headsets, the pressure level that may be achieved at low frequencies is reduced.

Reduction of the very low frequency output can be attempted by tailoring the loop response of the system to have a steep rate of low frequency roll-off. However, the approach is not practical; steep roll-off loop responses are usually accompanied by instability.

One solution is to move the loop response low frequency cutoff frequency higher and use only a moderate increase in roll-off rate. However, this approach reduces the amount of low frequency cancellation which can be achieved within the audio band, thus reducing the overall effectiveness of the noise cancellation system.

SUMMARY OF THE INVENTION

An active noise cancellation system according to the present invention provides a reduction in very low frequency overload susceptibility without sacrificing low frequency cancellation within the audio band.

According to one aspect of the present invention, an active noise cancellation system removes low frequency components of the feedback signal before the signal is processed to develop the cancellation signal without causing system instability. Since the noise cancellation system does not process the low frequency portion of the error signal, the system generates no corresponding cancellation signal, and is thus significantly less susceptible to being overloaded by the need to produce large low frequency signals.

Preferably, the low frequency portion of the noise to be canceled is sensed to produce a low frequency noise signal, and subtracted from the residual signal.

Preferably, the signal indicative of the low frequency portion of noise to be canceled is generated by an external sensor, located outside the region monitored by the residual noise sensor, and a low pass filter for filtering the output of the external sensor.

In accordance with another aspect of the present invention, a residual noise sensor and anti-noise generating actuator are disposed within an earpiece, and the low frequency signal derived by an isolated sensor external to the earpiece.

If desired, in the context of a twin earpiece headset, the signal generated by the external sensor is filtered by the low pass filter and provided to a respective subtractor in each of the earpieces.

Alternatively, in accordance with another aspect of the present invention, a cancellation system includes second residual noise sensors (each producing respective residual signals indicative of noise of respective locations), respective actuators for producing anti-noise, and respective processors. Preferably, the second residual noise sensor and the second actuator are located in the other earpiece of a headset. The external low frequency signal is subtracted from the second residual signal to produce the second modified residual signal.

In accordance with yet another aspect of the present invention, a twin earpiece headset employs the residual sensors of the respective earpieces to provide the low frequency signals for the subtractor from the residual signal employed in the other earpiece.

BRIEF DESCRIPTION OF THE DRAWING FIGURES

Preferred exemplary embodiments of the present invention will hereinafter be described in conjunction with the appended drawings, wherein like designations denote like elements and:

FIG. 1 is a schematic diagram of a single earpiece noise cancellation system according to the present invention;

FIG. 2 is a schematic diagram of a dual earpiece active noise cancellation headset according to the present invention employing a single external microphone.

DETAILED DESCRIPTION OF PREFERRED EXEMPLARY EMBODIMENTS

Figure 3:
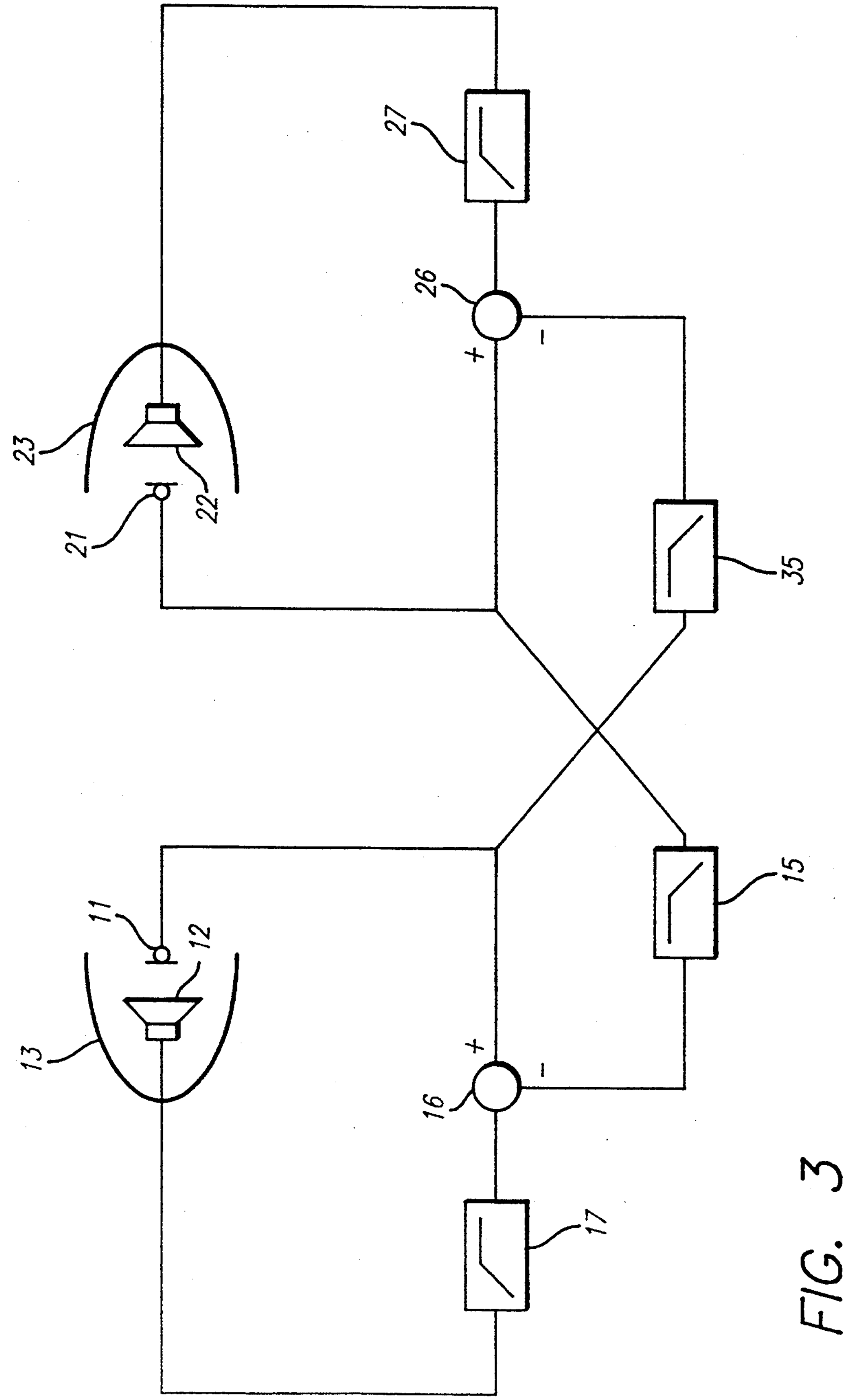
FIG. 3 is a schematic diagram of a dual earpiece active noise cancellation headset according to the present invention in which the residual noise sensor for each earpiece operate as external sensors for the opposite earpiece.

Referring to FIG. 1, an exemplary active noise cancellation system is shown schematically, specifically adapted for a noise canceling headset 10. Although the present invention is described herein with respect to a headset, application of the present invention is not limited to headsets. For the purposes of this disclosure, noise includes both periodic and non-periodic acoustic signals. A headset may comprise ear defenders, headphones, earphones, telephone handsets, and similar or related devices.

Headset 10 according to the present invention suitably includes first and second sensors (e.g., microphones) 11 and 14, a sound generator, e.g. a speaker 12, an earpiece 13, suitable frequency spectrum tailoring circuitry, such as a low pass filter 15, a suitable subtractor 16, and a suitable controller 17. Microphone 11 and speaker 12 are disposed in a location where noise is to be canceled, e.g. in the context of headset 10 within earpiece 13.

Microphone 11 is located in the earpiece, suitably close to the ear of the wearer to derive a relatively accurate representation of the sound perceived by the wearer. Sound generator 12, responsive to drive signals from controller 17, generates anti-noise to cancel unwanted sound, and is disposed to project the anti-noise into the location where the noise is to be canceled.

Sound generator 12 may comprise any suitable sound generator responsive to the controller signals, including, e.g. electromagnetic transducers, speakers and the like. Microphone 11 detects residual noise remaining after the combination of the unwanted noise and the anti-noise within earpiece 13.

Microphone 11, controller 17 and sound generator 12 form a feedback loop in which sound output by sound generator 12 combines with the noise field, and the combination is sensed by microphone 11 to produce an error or residual signal. The residual signal is provided to controller 17, which generates a cancellation signal.

Controller 17 processes the residual signal to develop a cancellation signal having the same waveform as the unwanted noise but inverted. Controller 17 thus responds to the residual signal by varying its signal to sound generator 12 so that noise is canceled at microphone 11 by sound generated by sound generator 12. Controller 17 may comprise any type of suitable controller, including analog controllers including suitable components for amplifying and filtering signals, or digital signal processing (DSP) controllers. This type of cancellation system (without external microphone 14 and low pass filter 15) employing residual feedback is known as a virtual earth noise cancellation system; the system always seeks to drive the sound perceived at microphone 11 to zero. Although the present invention is described with reference to a virtual earth active noise canceling system, it is also applicable to other feedback type active noise control systems, which may be susceptible to low frequency overload. An example of a virtual earth active noise control system is known from U.S. Pat. No. 4,473,906, issued Sep. 25, 1984, to Warnaka, et al.

Conventional virtual earth systems according to the arrangement described above, as well as other noise cancellation systems, are often susceptible to overload by very low frequency signals. In a cancellation system according to the present invention, however, very low frequency signals are removed so that very low frequency sound is not generated by sound generator 12.

Microphone 14 is suitably disposed so that the noise field sensed by external microphone 14 is isolated and relatively unaffected by the output of sound generator 12, e.g. mounted outside of earpiece 13. Microphone 14 must be isolated from sound generator 12 to prevent it from becoming part of the feedback loop. The output of microphone 14 is connected to the input of low pass filter 15 which attenuates all frequencies sensed by microphone 14 above a cutoff frequency. Subtractor 16 receives the output of microphone 11 and the output of low pass filter 15.

Because of its isolated position, e.g. outside of earpiece 13, microphone 14 measures ambient sound without attenuation caused by earpiece 13 or cancellation due to sound generator 12. The output of microphone 14 is filtered by low pass filter 15 to remove signal components having frequencies greater than a predetermined cutoff frequency, preferably approximately 20 Hz, leaving only the very low frequency (VLF) components outside of the normal range of human hearing.

The filtered VLF signal from external microphone 14 is then provided to subtractor 16. Subtractor 16 removes the low frequency signal components from the residual signal produced by microphone 11. Thus, very low frequency components of the unwanted noise are absent from the signal provided to controller 17. Controller 17 consequently does not process low frequency signals and does not produce drive signals at these very low frequencies, thereby significantly reducing the susceptibility of the system to low frequency overload. The perceived effectiveness of the cancellation in the headset, however, is not adversely affected; the VLF frequencies are below the normal range of human hearing.

A twin earpiece headset in accordance with the present invention, may be implemented, if desired, using two separate systems of the type shown in FIG. 1, i.e. two independent cancellation systems with a respective independent external microphone 14 employed for each earpiece 13. Alternatively, a single external microphone 14 may be advantageously used with both earpieces of a twin earpiece headset. Referring to FIG. 2, a second earpiece 23 is provided, housing a second microphone 21, a second sound generator 22, and cooperating with a second subtractor 26, and a second controller 27. Each of these components may be identical to its counterpart in FIG. 1. The feedback loop comprising microphone 21, subtractor 26, controller 27 and sound generator 22 operates in the same way as the virtual earth feedback loop described with reference to FIG. 1.

The output of low pass filter 15 is coupled to one input (suitably the inverting input) of subtractors 16 and 26. Because very low frequency noise has very long wavelengths, each earpiece perceives almost identical signals in the very low frequency range. Consequently, only one external microphone 14 is required to determine the waveform of the very low frequency noise. A single external microphone 14 may suitably be disposed on the headset to measure the noise field without cancellation or significant attenuation, for example on the headband coupling the earpieces or on one of the earpieces. The low frequency noise signal detected by microphone 14 and filtered by low pass filter 15 is subtracted from the residual signal for both earpieces 13 and 23, thus eliminating the low frequencies from the cancellation signal and reducing the potential for overload. This embodiment is advantageous in that it only requires one external microphone and low pass filter, instead of two microphones and two low pass filters as required by two separate systems for each earpiece.

A twin earpiece headset in accordance with the present invention may also be implemented without the use of an additional external microphone; external microphone 14 may be obviated by using the residual microphone for the opposite earpiece, instead of external microphone 14, as the source of the low frequency signal to be removed from the processed signal. Referring now to FIG. 3, the input of low pass filter 15 is coupled to microphone 21 of the opposite earpiece, and an additional low pass filter 35 is coupled between microphone 11 and an input of subtractor 26. The virtual earth feedback loops of this embodiment function in the same manner as described with reference to FIG. 1. The residual signal for each earpiece is conventionally provided to controller 17, 27 to be processed and to generate the cancellation signal. The residual signals from microphones 11 and 21 are also filtered by low pass filters 15 and 25, however, to generate the very low frequency noise signal to be subtracted from the residual signal of the opposite earpiece. Because low frequency noise perceived at each earpiece is approximately the same, subtracting the very low frequency signal perceived at one ear from the opposite residual signal effectively eliminates the very low frequency components from that residual signal, but retains the necessary isolation of the external microphone.

It will be understood that while various of the conductors and connections are shown in the drawing as single lines, they are not so shown in a limiting sense, and may comprise plural conductors or connections as understood in the art. Similarly, power connections, various control lines and the like, to the various elements are omitted from the drawing for the sake of clarity. Further, that above description is of preferred exemplary embodiments of the present invention, and the invention is not limited to the specific forms shown. For example, it is contemplated that these and other changes and substitutions may be made without departing from the spirit of the invention as described in the following claims.

I claim:

1. A virtual earth feedback system for actively canceling unwanted noise, comprising:

a sensor disposed to produce a residual signal representative of noise at a predetermined location;

means for generating a very low frequency noise signal representative of a very low frequency portion of said noise at said predetermined location;

means for subtracting said very low frequency noise signal from said residual signal to generate a modified residual signal;

a processor for producing anti-noise drive signals in accordance with said modified residual signal; and a sound generator for producing anti-noise in accordance with the drive signals.

2. A system according to claim 1, wherein said means for generating said very low frequency signal includes:

an incident noise sensor positioned proximate said residual sensor and acoustically isolated from said sound generator for generating an incident noise signal representative of the noise incident upon said predetermined location; and a filter connected to said second noise sensor to isolate low frequency components of the incident noise signal.

3. A system according to claim 1, wherein said residual noise sensor and said sound generator are mounted in a headset earpiece.

4. A system according to claim 1, wherein said residual noise sensor and said sound generator are mounted in a telephone handset earpiece.

5. A system according to claim 1, including:

a second residual noise sensor disposed to produce a second residual signal representative of noise at a second predetermined location;

second means for subtracting said low frequency noise signal from said second residual signal to generate a second modified residual signal;

a second processor for producing anti-noise drive signals in accordance with said second modified residual signal; and a second sound generator for producing anti-noise to cancel noise at said second predetermined location according with said drive signals generated by said processor.

6. A system according to claim 5, wherein said residual noise sensors and said sound generators are located in separate headset earpieces.

7. A virtual earth feedback method of reducing the overload susceptibility of an active noise cancellation system due to very low frequency components of noise to be canceled without significant adverse effect on the stability of the system, comprising the steps of:

generating a residual signal indicative of the noise at a predetermined location;

generating a very low frequency noise signal representative of a low frequency portion of the noise at the predetermined location;

subtracting the very low frequency noise signal from the residual signal to generate a modified residual signal;

producing anti-noise drive signals in accordance with said modified residual signal; and producing anti-noise in accordance with the drive signals.

8. An active virtual earth feedback noise cancellation headset, comprising:

at least one earpiece;

a sound generator, responsive to anti-noise drive signals applied thereto, disposed in said earpiece;

a sensor disposed to produce a residual signal representative of the noise at said earpiece;

means for generating a very low frequency noise signal representative of a low frequency portion of noise at the earpiece;

means for subtracting the very low frequency noise signal from the residual signal to generate a modified residual signal; and a processor for producing said anti-noise drive signals to said sound generator in accordance with said modified residual signal.

9. An active virtual earth feedback noise canceling system for canceling noise in at least two separate regions, comprising:

a first residual noise sensor in the first region to produce a first residual signal for the first region;

a second residual noise sensor in the second region to produce a second residual signal for the second region;

first means for producing very low frequency components of the first region residual noise to produce a first correction signal;

second means for producing very low frequency components of the second region residual noise to produce a second correction signal;

a first subtractor connected to said second low frequency means and said first residual noise sensor to subtract said second correction signal from said first residual signal to produce a first region modified signal;

a second subtractor connected to said first low frequency means and said second residual noise sensor to subtract said first correction signal from said second residual signal to produce a second region modified signal;

a first sound generator for producing anti-noise in the first region;

a second sound generator for producing anti-noise in the second region;

first processing means responsive to said first region modified signal to produce drive signals to drive said first sound generator to effect noise cancellation in the first region; and second processing means responsive to said second modified signal to produce drive signals to drive said second sound generator to effect noise cancellation in the second region.

10. A system according to claim 9, wherein:

said first low frequency means includes a first low pass filter connected to said first residual sensor for filtering said first residual signal; and said second low frequency means includes a second low pass filter connected to said second residual sensor for filtering said second residual signal.

* * * * *